United States Patent
Tanaka et al.

(10) Patent No.: US 9,810,754 B2
(45) Date of Patent: Nov. 7, 2017

(54) COOLING DEVICE FOR SUB-MRI UNITS AND MRI APPARATUS

(71) Applicant: TOSHIBA MEDICAL SYSTEMS CORPORATION, Otawara-Shi, Tochigi-Ken (JP)

(72) Inventors: Hidekazu Tanaka, Otawara (JP); Ken Kudou, Kasukabe (JP); Masashi Hori, Nasushiobara (JP)

(73) Assignee: TOSHIBA MEDICAL SYSTEMS CORPORATION, Otawara-Shi, Tochigen-Ken (JP)

( * ) Notice: Subject to any disclaimer, the term of this patent is extended or adjusted under 35 U.S.C. 154(b) by 902 days.

(21) Appl. No.: 14/222,150

(22) Filed: Mar. 21, 2014

(65) Prior Publication Data

US 2014/0203809 A1    Jul. 24, 2014

Related U.S. Application Data

(63) Continuation of application No. PCT/JP2013/064874, filed on May 29, 2013.

(30) Foreign Application Priority Data

Jun. 1, 2012   (JP) ................. 2012-126357

(51) Int. Cl.
  *G01R 33/38*  (2006.01)
  *G01R 33/385*  (2006.01)

(52) U.S. Cl.
  CPC ..... *G01R 33/3804* (2013.01); *G01R 33/3856* (2013.01)

(58) Field of Classification Search
  CPC .................... G01R 33/3804; G01R 33/3856
  See application file for complete search history.

(56) References Cited

U.S. PATENT DOCUMENTS

| | | | |
|---|---|---|---|
| 2009/0151374 A1* | 6/2009 | Kasahara | F25B 13/00 62/149 |
| 2010/0051307 A1* | 3/2010 | Tigwell | H01F 6/065 174/15.5 |

(Continued)

FOREIGN PATENT DOCUMENTS

| | | |
|---|---|---|
| JP | 6-294565 | 10/1994 |
| JP | 11-94408 | 4/1999 |

(Continued)

OTHER PUBLICATIONS

International Search Report for PCT/JP2013/064874 dated Jun. 25, 2013.

(Continued)

*Primary Examiner* — Rodney Bonnette
(74) *Attorney, Agent, or Firm* — Nixon & Vanderhye P.C.

(57) ABSTRACT

A cooling device for sub-MRI units of an embodiment includes a tank in which cooling water for cooling a heat generating unit that an MRI apparatus has is stored, a pump which circulates the cooling water stored in the tank through a circulation path starting from the tank and traveling around the heat generating unit, a heat exchanger which cools the cooling water, and a controller which decides that a water leakage has occurred on the circulation path when a decreasing rate of the cooling water in the tank is greater than a given reference value.

17 Claims, 5 Drawing Sheets

(56) References Cited

U.S. PATENT DOCUMENTS

| | | | | |
|---|---|---|---|---|
| 2012/0075045 A1* | 3/2012 | Calvert | ............... | H01F 6/04 335/216 |
| 2012/0180506 A1* | 7/2012 | Ochiai | ............... | F25B 49/005 62/126 |
| 2013/0174592 A1* | 7/2013 | Yamashita | ............... | F24F 1/06 62/126 |
| 2013/0192283 A1* | 8/2013 | Yamashita | ............... | F24F 1/32 62/126 |

FOREIGN PATENT DOCUMENTS

| | | |
|---|---|---|
| JP | 2004-257714 | 9/2004 |
| JP | 2007-89830 | 4/2007 |
| JP | 2010-104479 | 5/2010 |
| JP | 2011-87915 | 5/2011 |

OTHER PUBLICATIONS

English Translation of International Preliminary Report on Patentability dated Dec. 2, 2014 for Application No. PCT/JP2013/064874.

\* cited by examiner

COOLING DEVICE FOR SUB-MRI UNITS AND MRI APPARATUS

CROSS-REFERENCE TO RELATED APPLICATIONS

This application is a Continuation Application of No. PCT/JP2013/064874, filed on May 29, 2013, and the PCT application is based upon and claims the benefit of priority from Japanese Patent Applications No. 2012-126357 filed on Jun. 1, 2012, the entire contents of which are incorporated herein by reference.

FIELD

Embodiments of the invention relate to a cooling device for sub-MRI units and an MRI apparatus.

BACKGROUND

An MRI apparatus is an apparatus which produces an image of a test object placed in a static magnetic field by applying a radio frequency magnetic field to the test object and detecting a magnetic resonance signal that the applied magnetic field causes the test object to generate. Not only the radio frequency magnetic field but a gradient magnetic field is applied to the test object, so that spatial position information of the test object is added to the magnetic resonance signal.

A large pulse current is repeatedly applied to a gradient magnetic field coil in order that a gradient magnetic field is generated. The gradient magnetic field coil is caused to generate heat by the applied pulse current, and thus rises in temperature. A technology for cooling the gradient magnetic field coil by circulating water as coolant through a cooling tube provided close to the gradient magnetic field coil in order to keep the gradient magnetic field coil in a certain temperature range is known, e.g., as disclosed in Japanese Unexamined Patent Publication No. 2011-87915.

The MRI apparatus includes units which generate heat such as a gradient magnetic field power source which generates the pulse current to be applied to the gradient magnetic field coil, an RF amplifier which amplifies radio frequencies to be applied to the test object, a helium compressor and so on, in addition to the gradient magnetic field coil. These units are each called a heat generating unit of the MRI apparatus, hereafter. These heat generating units are each cooled by the cooling water similarly as the gradient magnetic field coil is.

A cooling device for sub-MRI units is a device which cools the cooling water having been warmed by the heat generating units. The cooling water having been warmed by the heat generating units is cooled by a heat exchanger that the cooling device has. A circulation path for the cooling water is formed among the heat generating units and the cooling device. The cooling water having been cooled by the heat exchanger is sent to the heat generating units by a pump of the cooling device.

The circulation path for the cooling water described above is formed by a plurality of piping sections. Each of the piping sections is joined with one another by joints. If the piping structure is locally broken or one of the joints is put out of joint, the water leaks from the broken portion. Occurrence of a water leakage not only seriously affects cooling performance of the MRI apparatus, but could degrade another apparatus installed in the same building.

An ordinary cooling device for the MRI apparatus, however, does not have an effective means for sensing a water leakage. Thus, a cooling device for sub-MRI units and an MRI apparatus which can certainly sense a water leakage are demanded.

SUMMARY

A cooling device for sub-MRI units of the embodiment includes a tank in which cooling water for cooling a heat generating unit that an MRI apparatus has is stored, a pump which circulates the cooling water stored in the tank through a circulation path starting from the tank and traveling around the heat generating unit, a heat exchanger which cools the cooling water, and a controller which decides that a water leakage has occurred on the circulation path when a decreasing rate of the cooling water in the tank is greater than a given reference value.

DESCRIPTION OF EMBODIMENTS

An embodiment of the invention will be explained below on the basis of the drawings.

(1) Entire Constitution

Figure 1:
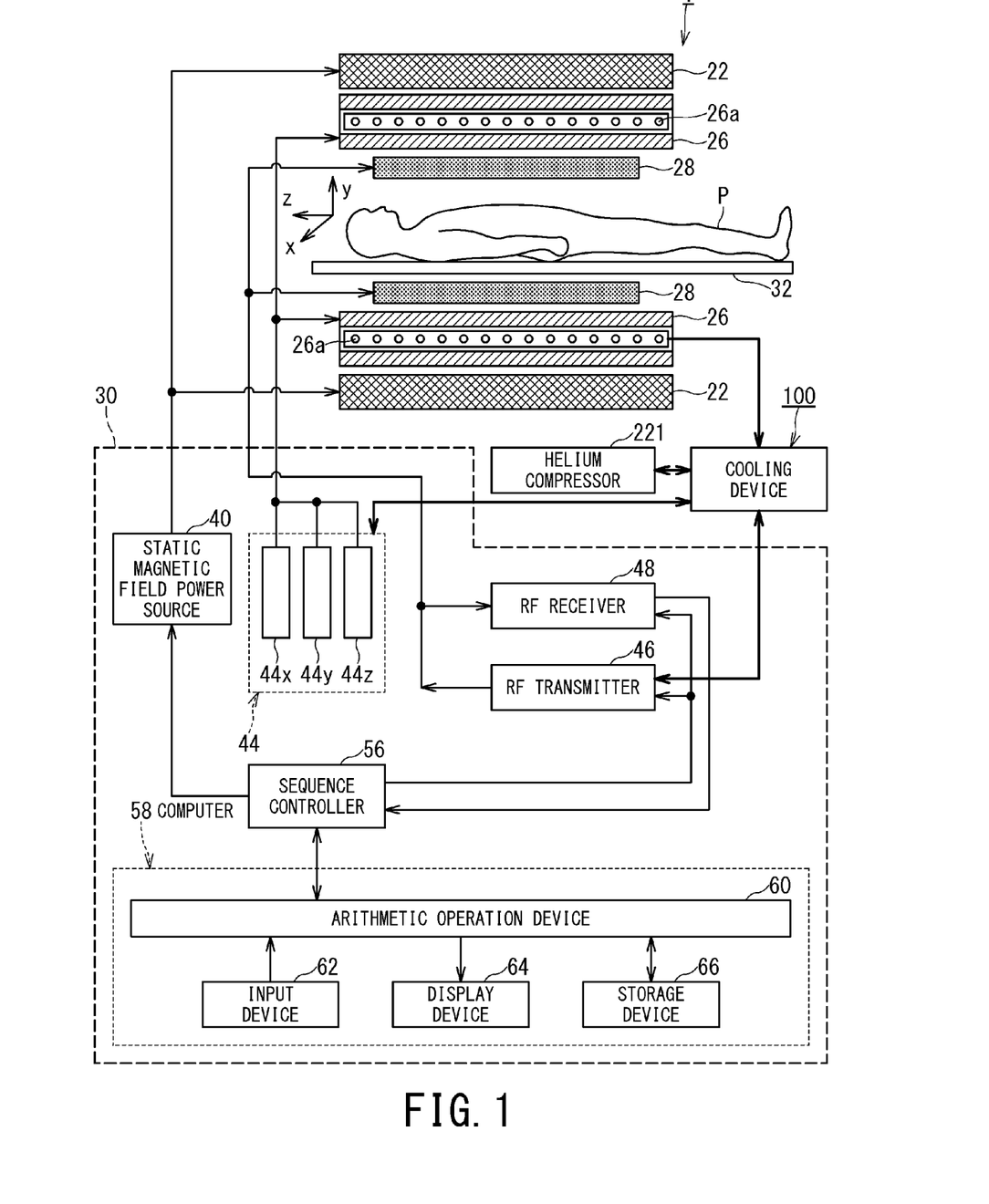
FIG. 1 shows an exemplary constitution of an MRI apparatus of the embodiment.

FIG. 1 is a block diagram which shows an entire constitution of an MRI (Magnetic Resonance Imaging) apparatus 1 of the embodiment. The MRI apparatus 1 is constituted by having a magnet for static magnetic field 22, a gradient magnetic field coil 26, an RF coil 28, a bed 32, a control unit 30, a cooling device 100 and so on.

Further, the control unit 30 has a static magnetic field power source 40, a gradient magnetic field power source 44 (for X-axis 44x, for Y-axis 44y, for Z-axis 44z), an RF transmitter (RF amplifier) 46, an RF receiver 48, a sequence controller 56 and a computer 58.

Still further, the computer 58 has an arithmetic operation device 60, an input device 62, a display device 64 and a storage device 66.

The magnet for static magnetic field 22 is shaped substantially like a cylinder, and generates a static magnetic field in a bore (the hollow inside of the cylindrical magnet for static magnetic field 22), i.e., the imaging area for the test object P. The magnet for static magnetic field 22 contains a superconductive coil, and generates the static magnetic field by applying a current supplied by the static magnetic field power source 40 to the superconductive coil. The superconductive coil contained in the magnet for static magnetic field 22 is cooled down to very low temperature by means of liquid helium, and the helium gas to keep a heat shield at low temperature in order to keep the inside of the static magnetic field at very low temperature is cooled by a helium compressor 221.

The gradient magnetic field coil 26 is shaped substantially like a cylinder as well, and is fixed inside the magnet for static magnetic field 22. The gradient magnetic field coil 26 applies a gradient magnetic field in each of the X-axis, Y-axis and Z-axis directions by means of a current supplied by the gradient magnetic field power source (44$x$, 44$y$ and 44$z$), respectively. Pipes for coil cooling 26$a$ through which the coolant (cooling water) to cool the gradient magnetic field coil 26 is let flow is provided close to the gradient magnetic field coil 26.

The RF coil 28 is fixed around and opposite the test object P inside the gradient magnetic field coil 26. The RF coil 28 irradiates the test object P with an RF pulse transmitted by the RF transmitter 46, and receives a magnetic resonance signal emitted from the test object P. The bed 32 is constituted movably in the horizontal direction, and moves into the bore carrying the test object P in time of imaging.

The RF transmitter 46 transmits an RF pulse to the RF coil 28 as instructed by the sequence controller 56. Meanwhile, the RF receiver 48 detects a magnetic resonance signal received by the RF coil 28, and transmits raw data to the sequence controller 56. The raw data is obtained by digitalizing the detected magnetic resonance signal.

The sequence controller 56 is controlled by the computer 58 so as to scan the test object P by driving the gradient magnetic field power source 44, the RF transmitter 46 and the RF receiver 48 individually. Then, if the RF receiver transmits raw data as a result of scanning, the sequence controller 56 transmits the raw data to the computer 58.

The computer 58 controls the MRI apparatus 1 as a whole. Specifically, the input device 62 accepts various inputs from an operator. Then, while making the sequence controller 56 scan on the basis of imaging conditions having been inputted, the arithmetic operation device 60 reconstructs an image on the basis of the raw data transmitted by the sequence controller 56. The reconstructed image is displayed on the display device 64, or stored in the storage device 66.

In the above constitution, the gradient magnetic field coil 26 is a unit of a significant amount of heat generation, and so are the gradient magnetic field power source 44, the helium compressor 221, the RF transmitter (RF amplifier) 46, etc. Those units are each called a heat generating unit, and the device which cools those heat generating units is the cooling device 100. The constitution, operation and so on of the cooling device 100 will be explained below.

(2) Constitution of Cooling Device

Figure 2:
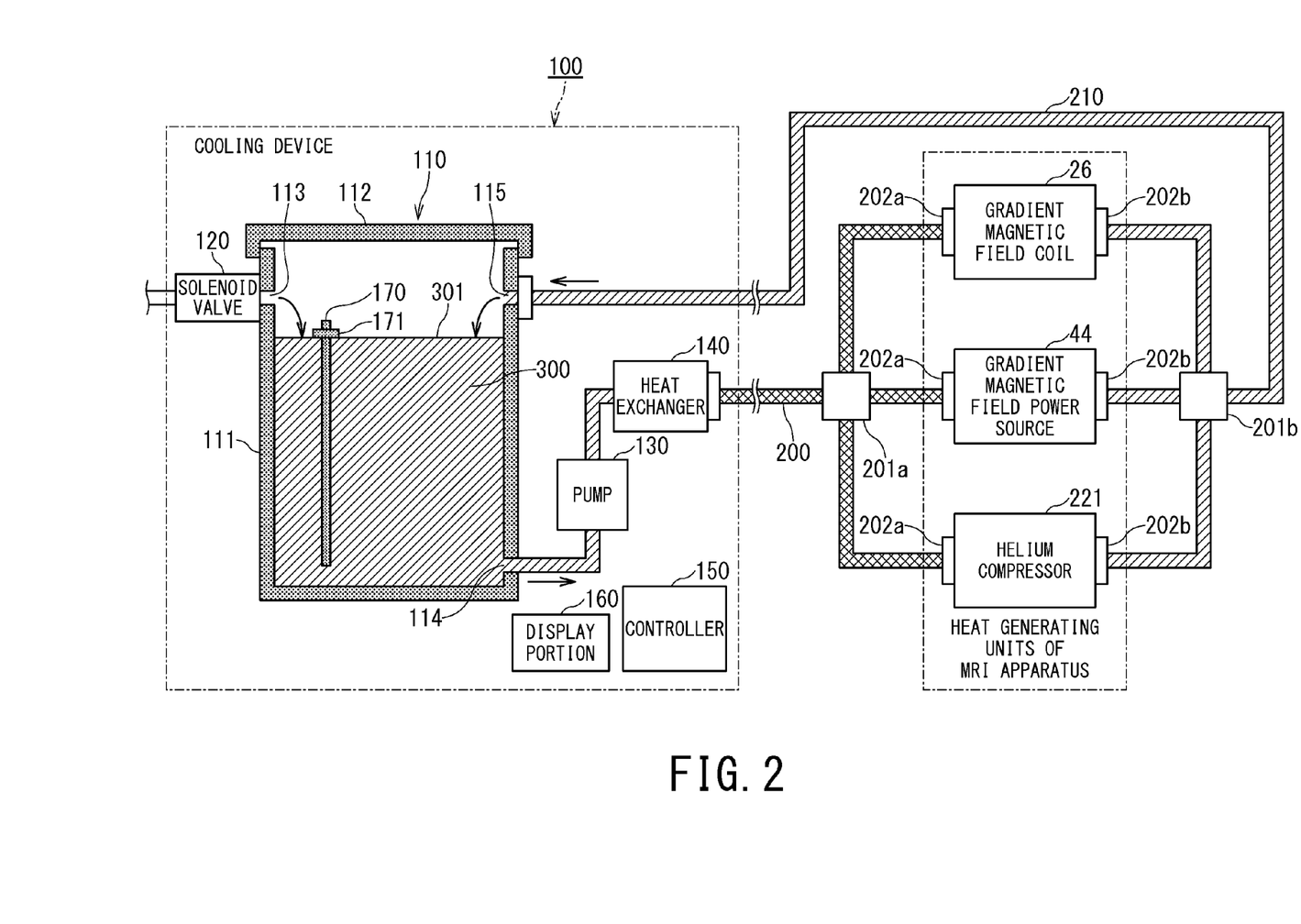
FIG. 2 shows an exemplary constitution of a cooling device of the embodiment and a first example of connections among heat generating units of the MRI apparatus and the cooling device.

FIG. 2 shows an exemplary constitution of the cooling device 100 of the embodiment, and exemplary heat generating units of the MRI apparatus 1 to be cooled by the cooling device 100 as well. In FIG. 2, e.g., the gradient magnetic field coil 26, the gradient magnetic field power source 44 and the helium compressor 221 are each a heat generating unit.

The cooling device 100 is constituted by having a tank 110 in which cooling water 300 is stored, a solenoid valve 120, a pump 130, a heat exchanger 140, a controller 150, a display portion 160, a water gauge 170 and so on.

The tank 110 has a tank vessel 111 and a lid 112. The tank vessel 111 is provided on its outer wall with a water intake 113 through which the cooling water in the tank 110 is supplied, a water outlet 114 through which the cooling water 300 is sent to the heat generating units, a back intake 115 through which the cooling water on its return after cooling the heat generating units is accepted, and so on.

The pump 130 is to circulate the cooling water 300 stored in the tank 110 through a circulation path starting from the tank 110 and traveling around the heat generating units. The heat exchanger 140 cools the cooling water sent out by the pump 130 by exchanging heat.

The solenoid valve 120 is to supply the tank 110 with the cooling water 300 from the outside. If the solenoid valve 120 is made open, the tank 110 is supplied with the cooling water 300. If the solenoid valve 120 is closed, the water supply is stopped.

The water gauge 170 senses the level of the cooling water 300 stored in the tank 110. The water gauge 170 shown in FIG. 2 is a float type water gauge having a float 171 which moves up and down according to the buoyancy principle, and senses the water level (height of the surface 301 of the cooling water 300 stored in the tank 110) by working a lead switch by means of a magnet put in the float so as to output a sensing signal. The water gauge 170 of the embodiment is not limited to one of the float type, and any type which can sense the water level in the tank 110 can be employed, such as an ultrasonic wave type, an electrostatic capacity type, a pressure type, etc.

The controller 150 not only entirely controls the cooling device 100, but controls the operation of the pump 130 and make and brake of the solenoid valve 120 on the basis of the water level sensed by the water gauge 170 as described later. The controller 150 is constituted by having, e.g., a processor, a ROM, a RAM, etc. The processor runs a program stored in the ROM so that the control described above is performed. Otherwise, the controller 150 may be constituted by hardware such as an ASIC, or may be constituted in such a way as to perform the control described above by means of a combination of software and hardware processing operations.

The display portion 160 indicates information on a failure decided by the controller 150, or information on a warning or an alarm as instructed by the controller 150.

Piping structures 200 and 210 to circulate the cooling water are arranged between the cooling device 100 and the heat generating units. The cooling water having been cooled by the heat exchanger 140 of the cooling device 100 is split into branches by a branching unit 201$a$, and flows into each of cooling means (not shown) that the respective heat generating units are provided with through each of input end joints 202$a$. The cooling water that heat is exchanged with by the cooling means of each of the heat generating units (cooling water having risen in temperature) flows out of each of output end joints 202$b$, gathers at a junction unit 201$b$ and goes back to the cooling device 100.

Although FIG. 2 shows an exemplary constitution in which three heat generating units (the gradient magnetic field coil 26, the gradient magnetic field power source 44 and the helium compressor 221) are cooled by the single cooling device 100, the numbers of the cooling units 100 and the heat generating units are not limited to the example shown in FIG. 2 and can be properly selected according to the amount of heat generation of the heat generating units to be cooled and the cooling performance of the cooling unit 100. What is shown in FIG. 2 is a typical constitution of, e.g., a 1.5 T (Tesla) type MRI apparatus.

Figure 3:
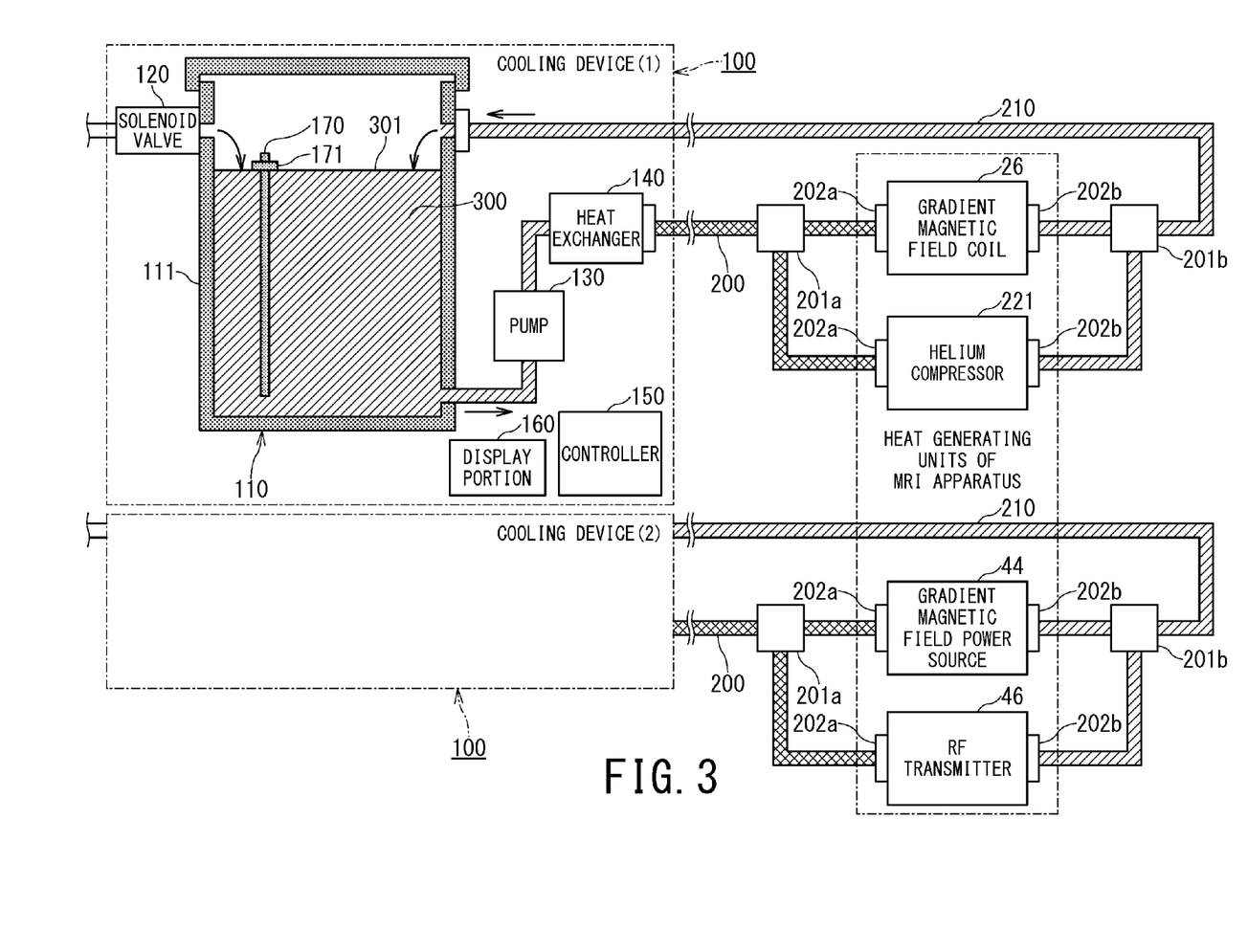
FIG. 3 shows an exemplary constitution of the cooling device of the embodiment and a second example of connections among the heat generating units of the MRI apparatus and the cooling device.

Meanwhile, intensity of the gradient magnetic field needs to be higher as intensity of the static magnetic field grows, and so does the amount of heat generated by the gradient magnetic field coil and the gradient magnetic field power source. In order to be ready for that, the MRI device 1 may be provided with a plurality of the cooling devices 100 which share the load of cooling the respective heat generating units.

FIG. 3 shows an exemplary constitution of, e.g., a 3 T type MRI apparatus, where two cooling devices 100 share the load of cooling four heat generating units. As shown in FIG. 3, e.g., the one of the cooling devices (1) 100 cools the gradient magnetic field coil 26 and the helium compressor 221, and the other one of the cooling devices (2) 100 cools the gradient magnetic field power source 44 and the RF amplifier 46.

If, by any chance, a portion of the piping structures 200 or 210 is damaged, or a portion of the input end joint 202a, the output end joint 202b, the branching unit 201a or the junction unit 201b is out of joint while the cooling device 100 is working, i.e., driving the pump 130 so as to circulate the cooling water, the water leaks from that portion. Occurrence of a water leakage seriously affects the performance in cooling the heat generating units of the MRI apparatus 1. Further, the cooling water having leaked could degrade another apparatus installed in the same building.

Thus, the cooling device 100 of the embodiment is provided with means for sensing occurrence of a water leakage quickly and correctly, for immediately stopping the pump 130 from working upon the occurrence of the water leakage being sensed so as to prevent the damage from spreading, and for giving the operator an immediate notice of the occurrence of the water leakage.

Meanwhile, the tank 110 needs to be supplied with the cooling water 300 as necessary as the cooling water 300 in the tank 110 gradually decreases owing to natural evaporation, even without occurrence of water leakage. An exemplary operation of the cooling device 100 of the embodiment will be specifically explained below.

(3) Operation of Cooling Device

If the cooling water 300 stored in the tank 110 decreases at a decreasing rate V being greater than a given reference value Vs, the cooling device 100 of the embodiment decides that the decrease of the cooling water 300 is not caused by natural evaporation but is caused by water leakage having occurred somewhere on the circulation path, and then stops the pump 130 from working so as to stop the circulation of the cooling water. Meanwhile, if the cooling water 300 stored in the tank 110 decreases at a decreasing rate V being smaller than the given reference value Vs, the cooling device 100 decides that the decrease is caused by natural evaporation in the tank 110. The controller 150 of the cooling device 100 makes the above decision, and performs the operation to stop the pump 130 from working.

More specifically, a first level L1 and a second level L2 which is lower than the first level L1 are set as levels of the cooling water 300 stored in the tank 110. Then, if the water gauge 170 senses the first level L1 and then senses the second level L2 within a lapse of time $T_{L1-L2}$ being shorter than a given reference lapse of time Ts, the controller 150 decides that water leakage has occurred somewhere on the circulation path and caused the drop of the water level, and stops the pump 130 from working so as to stop the circulation of the cooling water. In that case, the cooling water 300 decreases at a rate V corresponding to $(L1-L2)T_{L1-L2}$, and the reference value Vs corresponds to $(L1-L2)/Ts$.

Figure 4:
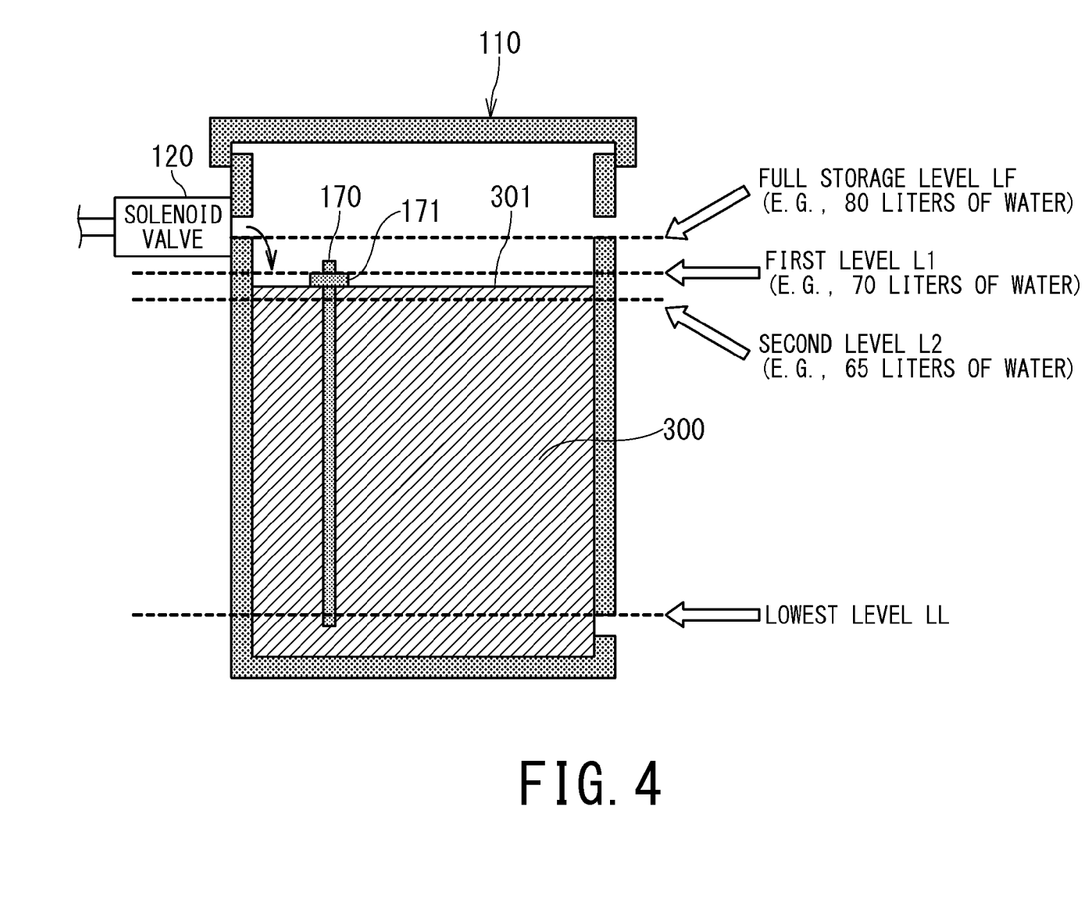
FIG. 4 schematically shows a relationship among the water level in the tank and first and second levels L1 and L2, respectively, having been set for decisions.

FIG. 4 schematically shows a relationship between the water level 301 in the tank 110 and the first and second levels L1 and L2, respectively, which are set for the decision. Further, FIG. 4 shows a full storage level LF and a lowest storage level LL as well. While the water is being supplied, the solenoid valve 120 is open and the water level 301 in the tank 110 rises. While no water is being supplied, natural evaporation could cause a drop in the water level 301, and so could water leakage. The water level 301 which is affected by those factors and changes can be sensed by the water gauge 170. Incidentally, if neither water leakage nor evaporation is assumed to exist while no water is being supplied, the water level 301 does not change as a rule, as the cooling water circulates through the circulation path.

The first and second levels L1 and L2 are set higher than at least half of the full storage level LF (LF/2) in order that occurrence of a water leakage can be sensed early. Assume, e.g., an amount of water fully stored in the tank 110 to be 80 liters. Then, the first level L1 is set to a water level corresponding to an amount of water of 70 liters (i.e., around 88 percent of the full storage level LF). Further, the second level L2 is set to a water level corresponding to an amount of water of 65 liters (i.e., around 82 percent of the full storage level LF).

Figure 5:
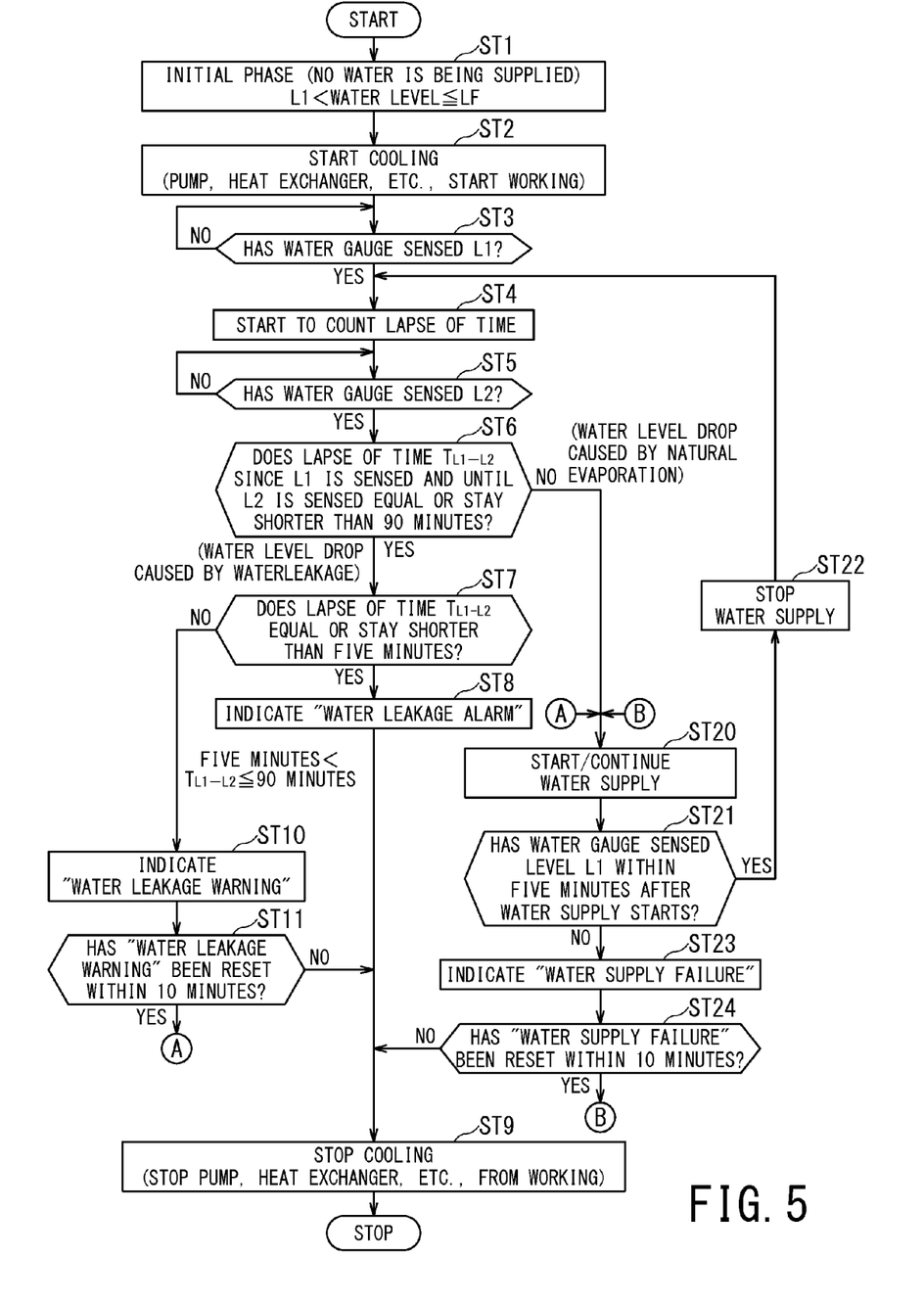
FIG. 5 is a flowchart which shows an exemplary operation of the cooling device of the embodiment.

FIG. 5 is a flowchart which shows an exemplary operation of the cooling device 100 of the embodiment, primarily performed by the controller 150 of the cooling device 100.

Assume, at an initial phase (step ST1), that the water level is higher than the first level L1, and equals or stays lower than the full storage level LF. Further, assume that the solenoid valve 120 is closed and no water is being supplied at the initial phase.

The cooling device 100 starts a cooling operation at a step ST2. Specifically, while driving the pump 130 so as to start circulating the cooling water, the controller 100 starts a cooling operation by means of the heat exchanger 140. The solenoid valve 120 remains closed and no water is being supplied at the phase of the step ST2. Thus, the water level drops from the initial level (higher than the first level L1) owing to natural evaporation or occurrence of a water leakage.

The controller 150 decides whether the water gauge 170 has sensed the first level L1 at a step ST3. The controller 150 starts to count a lapse of time immediately after the water gauge 170 senses the first level L1 (step ST4). The water level continues dropping owing to natural evaporation or occurrence of a water leakage.

The controller 150 decides whether the water gauge 170 has sensed the second level L2 which is lower than the first level L1 at a step ST5. The controller 150 obtains a lapse of time since the first level L1 is sensed and until the second level L2 is sensed, $T_{L1-L2}$, immediately after the water gauge 170 senses the second level L2. Then, the controller 150 decides whether the lapse of time $T_{L1-L2}$ equals or stays shorter than a second reference time length $T_{S2}$ (step ST6).

If the lapse of time $T_{L1-L2}$ equals or stays shorter than the second reference time length $T_{S2}$ (YES of step ST6), the controller 150 then decides whether the lapse of time $T_{L1-L2}$ equals or stays shorter than a first reference time length $T_{S1}$ at a step ST7.

The second reference time length $T_{S2}$ is set longer than the first reference time length $T_{S1}$, and is set, e.g., to 90 minutes in this occasion. On the other hand, the first reference time length $T_{S1}$ is set relatively short, and is set, e.g., to five minutes.

If the lapse of time $T_{L1-L2}$ is longer than the second reference time length $T_{S2}$ (e.g., 90 minutes) (NO of step ST6), the controller 150 decides that the water level has dropped owing to the natural evaporation, and the process goes to a step ST20. If the lapse of time $T_{L1-L2}$ equals or stays shorter than the second reference time length $T_{S2}$, on the other hand, the controller 150 decides that there is a possibility of a water leakage having occurred (first decision). The controller 150 then decides whether the lapse of time $T_{L1-L2}$ equals or stays shorter than the first reference time length $T_{S1}$ (e.g., five minutes) at the step ST7 (second decision). If the lapse of time $T_{L1-L2}$ equals or stays shorter than the first reference time length $T_{S1}$ (YES of step ST7), the controller 150 then decides that a water leakage has most probably occurred, immediately indicates a "water leakage alarm" (step ST8), and stops the pump 130 and the heat exchanger 140 from working as well (step ST9). The "water leakage alarm" is indicated locally on the display portion 160 of the cooling device 100, and may be indicated remotely on the display device 64 of the MRI apparatus 1 or on a suitable display device installed in the test room where the MRI apparatus 1 main body is installed, as well. Further, the operator may be notified of the "water leakage alarm" not only by visual indication but by a sound, etc.

Meanwhile, if the lapse of time $T_{L1-L2}$ equals or stays shorter than the second reference time length $T_{S2}$ but is longer than the first reference time length $T_{S1}$ (NO of step ST7), the controller 150 decides that occurrence of a water leakage, although being possible, cannot be certainly concluded, or that a water leakage has occurred but to an insignificant extent. In this occasion, the controller 150 indicates a "water leakage warning" on the display portion 160 of the cooling device 100 or on the display device 64 of the MRI apparatus 1 or the suitable display device installed in the test room in order to draw attention of the operator (step ST10).

Upon being notified of the "water leakage warning" indication, the operator checks whether a water leakage has occurred. If the operator identifies no water leakage and resets the "water leakage warning" indication within a given period of time to check, e.g., ten minutes, the process goes to the step ST20.

If the "water leakage warning" indication is not reset within the given period of time to check, on the other hand, the controller 150 decides that the possibility of a water leakage still remains without being entirely excluded, and stops the pump 130 and the heat exchanger 140 from working to stop the cooling operation (step ST9).

As described above, the "NO" decision of the step ST6, or the "YES" decision of the step ST11 leads to the step ST20. Although no water leakage has occurred in those two cases, the water level itself has dropped to the second level L2. Thus, water supply starts at the step ST20 in this case. Specifically, the controller 150 opens the solenoid valve 120 and supplies the tank 110 with cooling water from the outside.

If the water gauge 170 senses the first level L1 within a given period of time (e.g., five minutes) for reviewing the water supply after the water supply starts (YES of step ST21), the controller 150 closes the solenoid valve 120 and stops the water supply (step ST22). Then, the process returns to the step ST4, and the controller 150 restarts to count a lapse of time since the first level L1 is sensed. If the apparatus is free from a trouble such as a water leakage and the water level drops owing to only natural evaporation in this way, the water level is kept between the first level L1 and the second level L2 in the tank 110.

Meanwhile, if the water gauge 170 has not sensed the first level L1 within the given period of time for reviewing the water supply (NO of step ST21), the controller 150 decides that some failure has occurred in the water supply system including the solenoid valve 120 resulting in that normal water supply is prevented. The controller 150 indicates a "water supply failure" on the display portion 160 of the cooling device 100 or on the display device 64 of the MRI apparatus 1 or the suitable display device installed in the test room in order to draw attention of the operator (step ST23). Upon being notified of the "water supply failure" indication, the operator checks a failed portion in the water supply system such as the solenoid valve 120. If it is identified that the water supply system is free from failure or the failed portion is restored within a given period of time for checking, e.g., ten minutes, the operator resets the "water supply failure" indication. Upon the "water supply failure" indication being reset (YES of step ST24), then, the process returns to the step ST20 so that the water supply is continued. Unless the "water supply failure" indication is reset within the given period of time for checking (NO of step ST24), the controller 150 decides that the possibility of the water supply failure still remains without being excluded, and stops the pump 130 and the heat exchanger 140 from working to stop the cooling operation (step ST9).

The cooling device 100 of the embodiment described above can decide whether a water leakage has occurred or not on the basis of how fast the water level drops in the tank 110. Upon deciding that a water leakage has occurred, the cooling device 100 can immediately notify the operator of the fact, so that the MRI apparatus 1 can be previously protected from being damaged by the occurrence of the water leakage.

Further, the cooling device 100 can identify the cause of a drop of the water level as a water leakage or natural evaporation. If the cause of the drop is identified as the natural evaporation, the cooling device 100 can keep the water level within a specific range in the tank 110 by means of water supply through the solenoid valve 120. Besides, the cooling device 100 can identify the water level and time when water is supplied so as to decide whether the water supply system including the solenoid valve 120 is in failure or not.

Although some embodiments of the invention have been explained, these are presented as exemplary only, and it is not intended to limit the scope of the invention. These embodiments can be implemented in other various forms, and various omissions, replacements or changes can be done within the scope of the invention. These embodiments and their modifications are included in the scope or gist of the invention, and included similarly in the invention written in the claims and equivalents of it as well.

What is claimed is:

1. A cooling device for sub-MRI units, the cooling device comprising:
   a tank in which cooling water for cooling a heat generating unit that an MRI apparatus has is stored;
   a pump which circulates the cooling water stored in the tank through a circulation path starting from the tank and traveling around the heat generating unit;
   a heat exchanger which cools the cooling water; and
   a controller which decides that a water leakage has occurred on the circulation path when a decreasing rate of the cooling water in the tank is greater than a given reference value.

2. The cooling device for sub-MRI units according to claim 1, wherein
   the controller stops the pump from working to stop the circulation of the cooling water upon deciding that the water leakage has occurred on the circulation path.

3. The cooling device for sub-MRI units according to claim 1 further comprising a display portion, wherein
   the controller indicates occurrence of the water leakage on the display portion upon deciding that the water leakage has occurred on the circulation path.

4. An MRI apparatus comprising the cooling device for sub-MRI units according to claim 1.

5. The MRI apparatus according to claim 4, wherein the MRI apparatus has a plurality of the cooling devices for sub-MRI units which each share a load of cooling a plurality of heat generating units of the MRI apparatus.

6. A cooling device for sub-MRI units, the cooling device comprising:
   a tank in which cooling water for cooling a heat generating unit that an MRI apparatus has is stored;
   a pump which circulates the cooling water stored in the tank through a circulation path starting from the tank and traveling around the heat generating unit;
   a heat exchanger which cools the cooling water;
   a water gauge which senses a first level of the cooling water stored in the tank and a second level being lower than the first level; and
   a controller which decides that a water leakage has occurred on the circulation path when the water gauge senses the first level and then the second level within a lapse of time being shorter than a given reference period of time.

7. The cooling device for sub-MRI units according to claim 6, wherein
   the controller stops the pump from working to stop the circulation of the cooling water upon deciding that the water leakage has occurred on the circulation path.

8. The cooling device for sub-MRI units according to claim 6 further comprising a display portion, wherein
   the controller indicates occurrence of the water leakage on the display portion upon deciding that the water leakage has occurred on the circulation path.

9. The cooling device for sub-MRI units according to claim 6, wherein
   the first level and the second level are both set higher than half of a full storage water level in the tank.

10. The cooling device for sub-MRI units according to claim 6 further comprising a display portion, wherein
    the controller stops the pump from working to stop the circulation of the cooling water and indicates occurrence of the water leakage on the display portion upon deciding that the water leakage has occurred on the circulation path.

11. The cooling device for sub-MRI units according to claim 10, wherein
    the controller decides that the water leakage has possibly occurred on the circulation path and indicates a water leakage warning on the display portion when the lapse of time is shorter than a second reference period of time set longer than the reference period of time.

12. The cooling device for sub-MRI units according to claim 1, wherein
    the controller stops the pump to stop the circulation of the cooling water when the indication of the water leakage warning is not reset within a given period of time for checking, and
    the controller continues the circulation of the cooling water without stopping the pump from working when the indication of the water leakage warning is reset within the given period of time for checking.

13. The cooling device for sub-MRI units according to claim 6 further comprising a solenoid valve for supplying the cooling water from the outside, wherein
    the controller decides, when the lapse of time is longer than a second reference period of time set longer than the reference period of time, that the level of the cooling water has dropped owing to evaporation, so as to open the solenoid valve after sensing the second level and to supply the tank with water.

14. The cooling device for sub-MRI units according to claim 13, wherein
    the controller closes the solenoid valve so as to stop supplying the tank with water when the water gauge senses the first level within a given period of time for reviewing the water supply after the water supply to the tank starts.

15. The cooling device for sub-MRI units according to claim 14 further comprising a display portion, wherein the controller:
    indicates a water supply failure on the display portion when the water gauge does not sense the first level within the period of time for reviewing the water supply after the water supply to the tank starts;
    stops the pump from working so as to stop the circulation of the cooling water when the indication of the water supply failure is not reset within a given period of time for checking, and;
    continues to supply the tank with water when the indication of the water supply failure is reset within the period of time for checking.

16. The cooling device for sub-MRI units according to claim 6, wherein the water gauge is a float type water gauge.

17. A cooling device for sub-MRI units, the cooling device comprising:
    a tank in which cooling water for cooling a heat generating unit that an MRI apparatus has is stored;
    a pump which circulates the cooling water stored in the tank through a circulation path starting from the tank and traveling around the heat generating unit;
    a heat exchanger which cools the cooling water; and
    a controller which decides that a water leakage has occurred on the circulation path when a decreasing rate of the cooling water in the tank is greater than a given reference value, and decides that the cooling water is evaporating in the tank when the decreasing rate of the cooling water in the tank is smaller than the reference value.

* * * * *